(12) United States Patent
Werkhoven et al.

(10) Patent No.: US 7,452,757 B2
(45) Date of Patent: Nov. 18, 2008

(54) SILICON-ON-INSULATOR STRUCTURES AND METHODS

(75) Inventors: Christiaan J. Werkhoven, Tempe, AZ (US); Ivo Raaijmakers, Bilthoven (NL); Chantal Arena, Mesa, AZ (US)

(73) Assignee: ASM America, Inc., Phoenix, AZ (US)

( * ) Notice: Subject to any disclaimer, the term of this patent is extended or adjusted under 35 U.S.C. 154(b) by 819 days.

(21) Appl. No.: 10/434,423

(22) Filed: May 7, 2003

(65) Prior Publication Data

US 2004/0097022 A1    May 20, 2004

Related U.S. Application Data

(60) Provisional application No. 60/455,018, filed on Mar. 12, 2003, provisional application No. 60/378,868, filed on May 7, 2002.

(51) Int. Cl.
*H01L 21/00* (2006.01)

(52) U.S. Cl. .................. 438/149; 438/479; 438/496; 257/E21.129; 257/E21.133; 257/E21.562

(58) Field of Classification Search ................ 438/149, 438/479, 496; 257/E21.129, E21.133, E21.562, 257/347, 348, 349
See application file for complete search history.

(56) References Cited

U.S. PATENT DOCUMENTS

| | | | |
|---|---|---|---|
| 4,199,773 A | | 4/1980 | Goodman et al. |
| 4,935,382 A | * | 6/1990 | Johnston et al. ............. 117/105 |
| 5,037,774 A | * | 8/1991 | Yamawaki et al. ............. 117/8 |
| 5,159,413 A | * | 10/1992 | Calviello et al. ............. 505/191 |
| 5,256,550 A | * | 10/1993 | Laderman et al. ........... 438/509 |
| 5,310,696 A | * | 5/1994 | McCann et al. ............... 117/58 |
| 5,393,352 A | | 2/1995 | Summerfelt |

(Continued)

FOREIGN PATENT DOCUMENTS

JP              63305529         * 12/1988

OTHER PUBLICATIONS

Antonell et al., "Composition dependence of solid-phase epitaxy in silicon-germanium alloys: Experiment and theory." The American Physical Society, vol. 51, No. 12, Mar. 1995, pp. 7762-7771.

(Continued)

*Primary Examiner*—Thomas L Dickey
*Assistant Examiner*—Fazli Erdem
(74) *Attorney, Agent, or Firm*—Knobbe, Martens, Olson & Bear LLP

(57) ABSTRACT

Silicon-on-insulator (SOI) structures are provided by forming a single-crystal insulator over a substrate, followed by heteroepitaxy of a semiconductor layer thereover. Atomic layer deposition (ALD) is preferably used to form an amorphous insulator, followed by solid phase epitaxy to convert the layer into a single-crystal structure. Advantageously, the crystalline insulator has a lattice structure and lattice constant closely matching that of the semiconductor formed over it, and a ternary insulating material facilitates matching properties of the layers. Strained silicon can be formed without need for a buffer layer. An amorphous $SiO_2$ layer can optionally be grown underneath the insulator. In addition, a buffer layer can be grown, either between the substrate and the insulator or between the insulator and the semiconductor layer, to produce desired strain in the active semiconductor layer.

12 Claims, 5 Drawing Sheets

U.S. PATENT DOCUMENTS

| | | | |
|---|---|---|---|
| 5,478,653 | A | 12/1995 | Guenzer |
| 6,140,209 | A * | 10/2000 | Iwane et al. ............... 438/458 |
| 6,165,837 | A * | 12/2000 | Kawakubo et al. .......... 438/244 |
| 6,346,732 | B1 | 2/2002 | Mizushima et al. |
| 6,583,034 | B2 * | 6/2003 | Ramdani et al. ............. 438/507 |
| 6,683,012 | B2 * | 1/2004 | Hata et al. .................. 438/785 |
| 6,693,298 | B2 * | 2/2004 | Eisenbeiser et al. ........... 257/63 |
| 2001/0052621 | A1* | 12/2001 | Beaman ...................... 257/347 |
| 2003/0008521 | A1* | 1/2003 | Bojarczuk et al. ........... 438/752 |
| 2003/0127646 | A1* | 7/2003 | Christiansen et al. ......... 257/55 |
| 2005/0266663 | A1* | 12/2005 | Bojarczuk et al. ........... 438/482 |

OTHER PUBLICATIONS

Bauer et al., "Crystalline to amorphous phase transition in very low temperature molecular beam epitaxy," Materials Science and Engineering B89 (2002) pp. 263-268.

Bauer et al., "High Ge content photodetectors on thin SiGe buffers," Elsevier, Materials Science & Engineering B 89 , pp. 77-83, (2002).

Bauer et al., "Time resolved reflectivity measurements of silicon solid phase epitaxial regrowth," Elsevier, Thin Solid Films 364, pp. 228-232, (2000).

Bauer et al., "Relaxed SiGe bufffers with thicknesses below 0.1 m," Thin Solid Films 369 (2000) pp. 152-156.

H.J. Herzog et al., "Si/siGe n-MODFETs on thin SiGe virtual substrates prepared by means of He implantation," IEEE Electronic Device Letters, vol. 23, No. 8, (2002), pp. 485-487.

Huang et al., "SiGe-on-insulator prepared by wafer bonding and layer transfer for high-performance field-effect transistors," Applied Physics Letters, vol. 78, No. 9, (2001), pp. 1267-1269.

Kasper et al., "New virtual substrate concept for vertical MOS transistors," Elsevier, Thin Solid Films 336, pp. 319-322, (1998).

Kommu et al., "A Theoretical/Experimental Study of Silicon Epitaxy in Horizontal Single-Wafer Chemical Vapor Deposition Reactors," Journal of the Electrochemical Society, 147 (4), pp. 1538-1550, (2000).

Kutsukake et al., "Fabricatoin of SiGe-on-Insulator through Thermal Diffusion of Ge on Si-on-Insulator Substrate," Jpn. J. Appl. Phy7s. vol. 42, pp. L232-L234, (2003).

Luysberg et al., "Effect of helium ion implantatin and annealing on the relaxation behavior of psuedomorphic Si1-xGex buffer layers on Si (100) substrates," Journal of Applied Physics, vol. 92, No. 8, (2002), pp. 4290-4295.

Lyutovich et al., "Thin SiGe buffers with high GE content for n-MOSFETs," Materials Science and Engineering B89 (2002) pp. 341-345.

Lyutovich et al., "Relaxed SiGe buffer layer growth with point defect injection," Materials Science and Engineering B71 (2000) pp. 14-19.

Ni. et al., "Xray reciprocal space mapping studies of strain relaxation in thin SiGe layers ($\leq$100nm) using a low temperature growth step," J. Cryst. Growth 227-228 (2001) pp. 756-760.

Nieminen et al., "Surface-controlled growth of LaA1$0_3$ thin films by atomic layer epitaxy," J. Mater. Chem, 11; pp. 2340-2345, (2001).

Sugii et al., "SiGe-on-insulator substrate fabricated by melt solidification for a strained-silicon complementary metal-oxide-semiconductor," J. Vac. Sci. Technol. B 20(5), pp. 1891-1896, Sep./Oct. 2002.

\* cited by examiner

SILICON-ON-INSULATOR STRUCTURES AND METHODS

REFERENCE TO RELATED APPLICATIONS

The present invention claims priority under 35 U.S.C. §119(e) to U.S. Provisional Application No. 60/455,018, filed Mar. 12, 2003 and U.S. Provisional Application No. 60/378,868, filed May 7, 2002.

FIELD OF THE INVENTION

The present invention relates generally to silicon-on-insulator ("SOI") technology in integrated circuit fabrication.

BACKGROUND OF THE INVENTION

To improve device performance, a trend is developing for replacing conventional "bulk" silicon wafers with so-called silicon-on-insulator ("SOI") wafers. The advantage of SOI technology is that the silicon in which transistors are made is not in electrical contact with the remainder of the wafer, such that no cross-talk among transistors takes place. The transistors are electrically isolated from one another.

SOI technology typically employs a thin (e.g., about 100 nm) insulating layer between the active semiconductor layer and the wafer, across the entire wafer or at least in those areas where active devices will be formed in the semiconductor layer. Silicon oxide, silicon nitride, or a combination of the two are typically employed as the insulating layer. These materials are amorphous, have excellent electrical properties, and the technology for integrating silicon nitride and/or silicon oxide is very well developed.

Two conventional technologies have been developed forming the SOI structures. One technology, known as SIMOX, starts with a semiconductor structure such as a silicon wafer and employs high energy implantation of oxygen atoms to form an oxide layer greater than about 100 nm below the surface of the silicon wafer. High temperature annealing then forms a buried silicon oxide, and at the same time repairs crystal defects in the surface silicon that are created by implantation. The surface silicon remains a semiconductor material, and the crystal structure thereof is restored by the annealing process. These steps are rather expensive, however, and the quality of the insulating layer and the active silicon thereover is somewhat compromised.

Another method for forming SOI structures is based on bonding a sacrificial silicon wafer onto an oxidized silicon wafer. By grinding or another thinning process, the sacrificial silicon wafer is reduced to a very thin, active semiconductor layer over the oxide from the other substrate. The thinning process, however, is critical to achieving high quality in the SOI structure, since the ultimately desired thickness uniformity of the active semiconductor layer is about 5 nm±0.1 nm. Furthermore, the bonding and thinning processes are complicated and rather expensive.

Accordingly, a need exists for improved structures and processes for providing SOI substrates with high quality insulating and semiconductor layers.

SUMMARY OF THE INVENTION

In accordance with one aspect of the invention, a method for forming a semiconductor-on-insulator structure includes forming an epitaxial insulator on a substrate, and forming an epitaxial semiconductor on the epitaxial insulator.

In accordance with another aspect of the invention, a process for forming an integrated circuit includes depositing an amorphous insulating layer by an atomic layer deposition process over a semiconductor substrate. The amorphous insulating layer is converted into a highly crystalline material. A semiconductor structure is then deposited over the crystalline insulating material.

In another aspect of the invention, a $SiO_2$ layer is grown under an epitaxial insulator layer by exposing the substrate comprising an epitaxial layer to an oxidizing environment. In one embodiment this is done by adding an oxidant to the environment during solid phase epitaxy treatment.

In a further aspect of the invention a buffer layer is deposited to produce strain in the active semiconductor layer. In one embodiment a buffer layer, preferably silicon germanium, is deposited after epitaxial insulator growth. In another embodiment a buffer layer is deposited on the substrate prior to formation of the epitaxial insulator. In this embodiment, a graded layer, such as a graded silicon germanium layer, may be deposited prior to deposition of the buffer layer.

In accordance with another aspect of the invention, a semiconductor-on-insulator structure includes a substrate, a crystalline insulator epitaxially formed over the substrate; and a crystalline semiconductor layer heteroepitaxially formed over the crystalline insulator. In one embodiment the structure also comprises a $SiO_2$ layer under the epitaxial insulator.

BRIEF DESCRIPTION OF THE DRAWINGS

These and other aspects of the invention will be readily apparent from the detailed description below and from the appended drawings, which are meant to illustrate and not to limit the invention, and in which.

DETAILED DESCRIPTION OF THE PREFERRED EMBODIMENTS

Preferred Process

The preferred embodiments employ a highly crystalline (largely single-crystal with minimal faults) material as an insulator in a silicon-on-insulator ("SOI") structure. As used herein, "single-crystal" or "epitaxial" is used to describe a predominantly large crystal structure that may have a tolerable number of faults therein. The skilled artisan will appreciate that crystallinity of a layer generally falls along a continuum from amorphous to polycrystalline to single-crystal; the skilled artisan can readily determine when a crystal structure can be considered single-crystal or epitaxial, despite low density faults.

Advantageously, formation of a single-crystal insulator permits employing a simple, relatively low-cost deposition of a uniform insulating or dielectric layer, and a subsequent heteroepitaxial deposition of an active crystalline semiconductor layer. Epitaxy refers to deposition where the deposited layer serves as an extension of the crystal structure of an underlying layer. Heteroepitaxy is a species of epitaxy in which the underlying layer and the overlying deposited layer are of different materials.

Heteroepitaxy deposition techniques are well known in the art and, in fact, are considered advantageous in creating crystal strain by the lattice mismatch between the underlying layer and the overlying layer. Typically, such heteroepitaxial layers are formed by epitaxially depositing silicon germanium (SiGe) over a single-crystal silicon structure, such that the lattice constants of the two layers are not exactly matched. This strain is considered advantageous because it tends to increase electrical carrier mobility within the semiconductor structure, thus boosting transistor performance. Heteroepitaxy is commonly employed in depositing SiGe base layers over the Si collectors of heterojunction bipolar transistors (HBTs).

Thus, not only do the preferred embodiments avoid the complexities of oxygen implantation or bonding and grinding of sacrificial silicon wafers, but the preferred embodiments described herein can also lead to improved performance by providing strained heteroepitaxial layers. Furthermore, by directly forming the semiconductor layer over the insulator, a lattice strained layer can be produced without the need for an additional buffer layer (as conventionally used for SiGe base layers over Si collector regions) to produce the desired strain.

Figure 1:
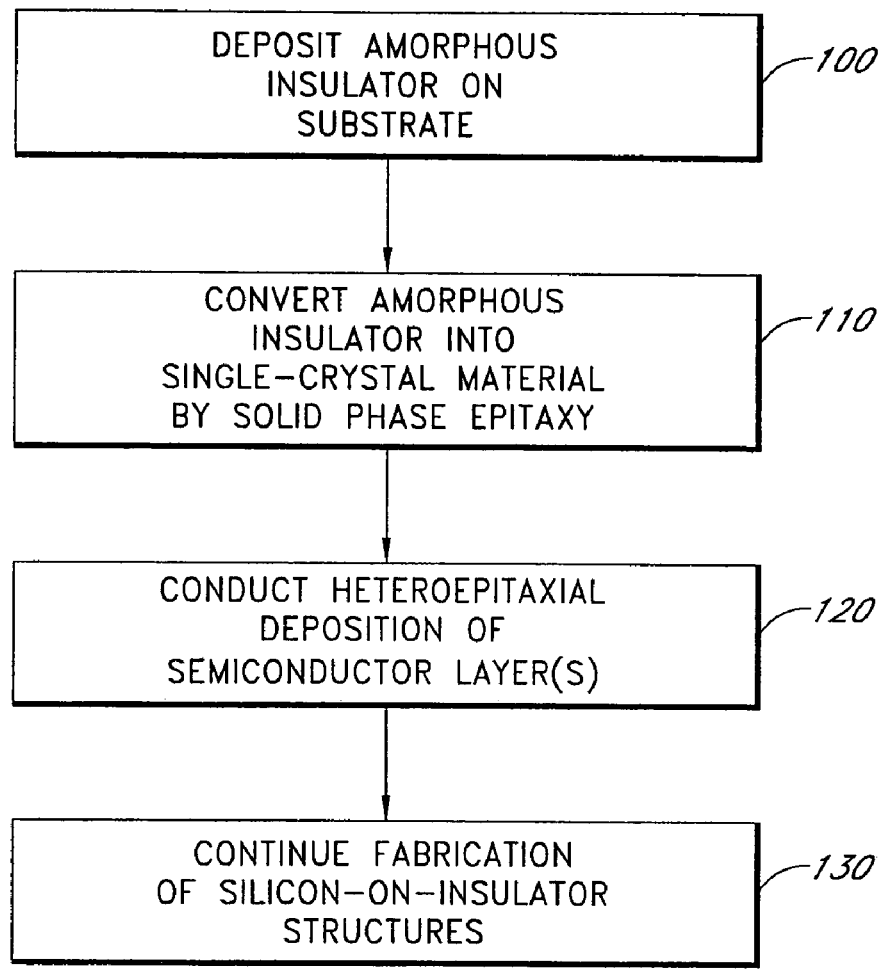
FIG. 1 is a flow chart generally illustrating methods according to a preferred embodiment of the present invention.

Referring now to FIG. 1, a general method in accordance with the preferred embodiments is illustrated. Initially, a single-crystal insulating layer is formed over a substrate. In the illustrated embodiment, this formation is conducted in two stages: first an amorphous insulator is deposited 100 on the substrate; this amorphous insulator is then converted 110 into a single-crystal material by a high temperature anneal known in the art as solid phase epitaxy (SPE). The deposition 100 and conversion 110 steps will be discussed in more detail below. In other embodiments the insulator is directly deposited epitaxially (not shown).

Following formation of the single-crystal insulator layer, whether by direct epitaxy or SPE, a heteroepitaxial deposition 120 of one or more semiconductor layer(s) is conducted over the single-crystal insulator. As noted above, well-known methods exist for such heteroepitaxy, in general. Such processes range from batch, furnace-based low pressure CVD (LPCVD) to single-wafer, cold wall chamber-based rapid thermal chemical vapor deposition (RTCVD) processes, employing any of a number of silicon precursors, carrier gases, and performed under a variety of pressures, flow rates and temperatures. Generally, as noted above, such heteroepitaxy deposition techniques are applied in the art for depositing SiGe over Si, whereas the present disclosure describes heteroepitaxy of a semiconductor (e.g., SiGe or Si) over an insulator material.

Fabrication can then continue 130 by any suitable process known to the skilled artisan.

As discussed above, it is desirable to have some strain in the semiconductor layer deposited over the insulator. However, the situation may occur wherein the epitaxial insulator, such as an epitaxial oxide layer, is itself strained by a mismatch with the lattice constant of the underlying substrate. This situation may occur, for example, if an underlying $SiO_2$ layer is not formed. If the epitaxial insulator is strained, a subsequently deposited semiconductor layer may end up having the lattice parameters of the underlying substrate and thus will not be strained. The present invention provides several methods for dealing with this situation.

In one embodiment, following epitaxial insulator growth, such as epitaxial oxide, a thick enough buffer layer of SiGe is grown such that after relaxation the lattice parameters of the buffer layer are increased. A subsequently deposited silicon layer will then be strained to a level that is determined by the germanium concentration and the degree of relaxation of the SiGe buffer layer. Other materials besides SiGe that are able to be grown on an epitaxial insulator and that relax with a lattice parameter larger than Si may be used as well. The composition of the buffer layer may be controlled to achieve the desired strain in a subsequent Si layer.

Figure 3:
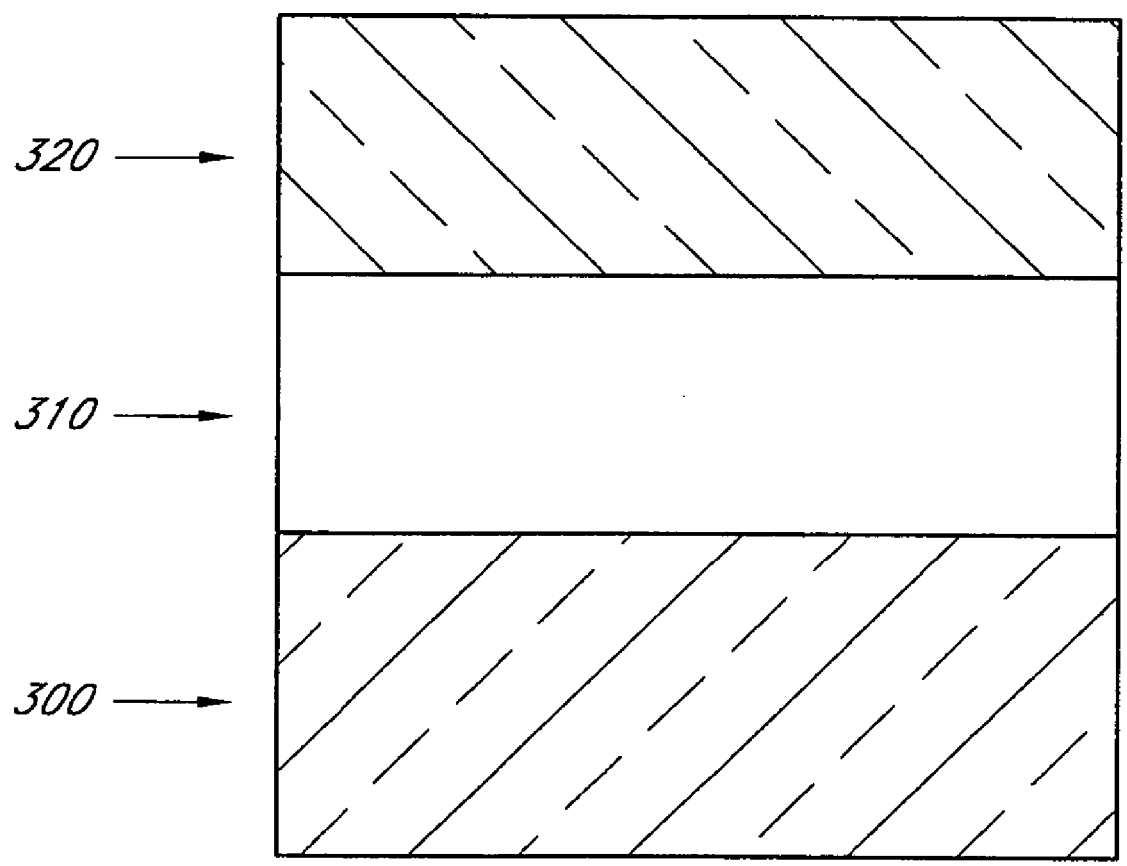
FIG. 3 is a diagram illustrating strained silicon germanium grown over an epitaxial oxide layer, in accordance with one embodiment.

An example of this embodiment is illustrated in FIG. 3. In this example an epitaxial oxide layer (310) is aligned with the lattice parameter of the bulk silicon substrate (300) at approximately 5.43 angstroms, and thus is strained. The SiGe buffer layer (320) on top of the epitaxial oxide (310) will be in the compression state due to its larger lattice parameter. The lattice parameter for SiGe will be greater than 5.43 angstroms, the lattice parameter for silicon, but less than 5.65 angstroms, the lattice parameter for pure germanium, depending on the exact stoichiometry of the SiGe. A subsequently deposited silicon layer (not shown) will then be strained to a level determined by the lattice parameter of the relaxed buffer layer.

Figure 4:
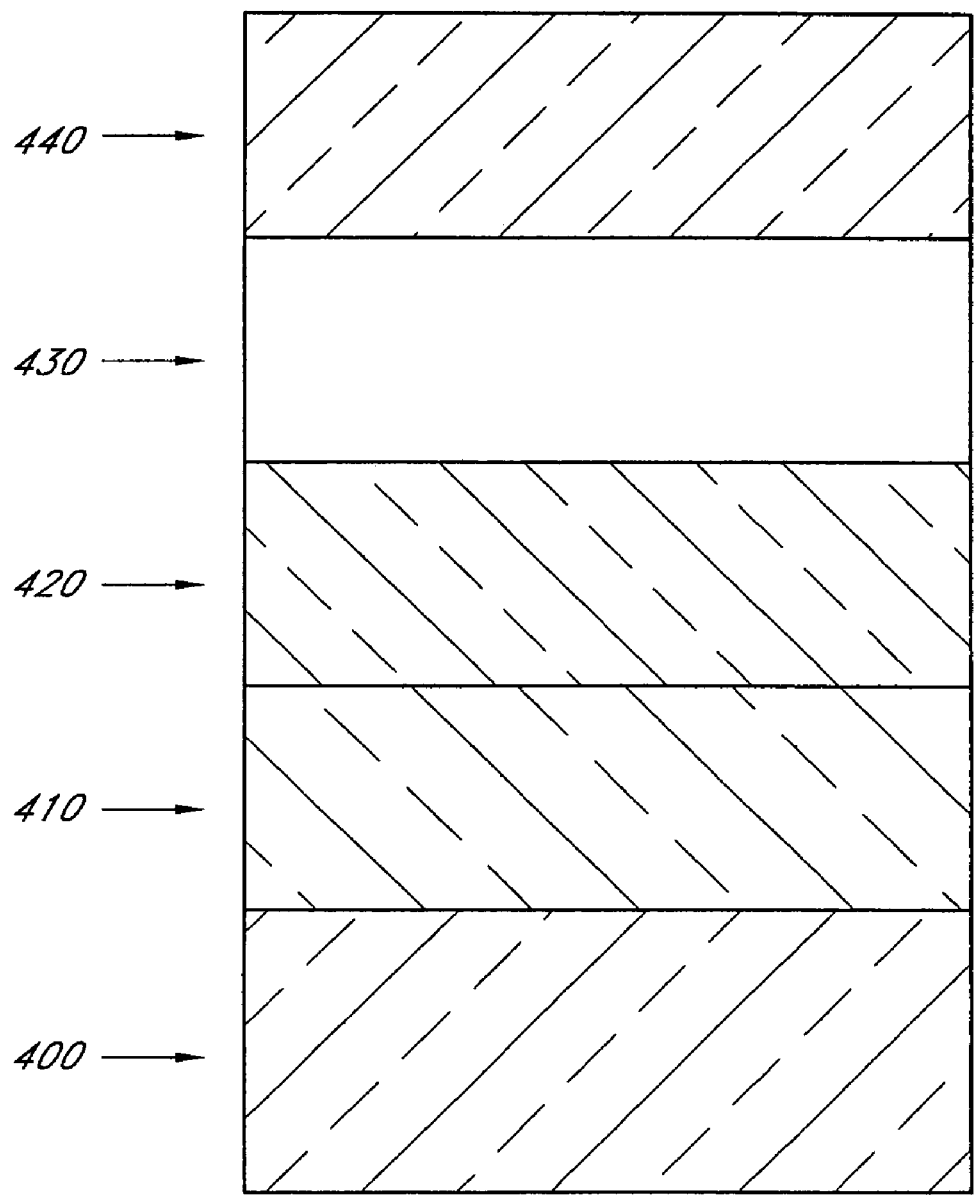
FIG. 4 is a diagram illustrating a silicon germanium buffer layer present between the silicon substrate and the epitaxial oxide insulator, in accordance with another embodiment.

In another embodiment (FIG. 4) a SiGe buffer layer (420) is grown prior to growth of the epitaxial insulating layer (430), such as an epitaxial oxide layer. The SiGe layer increase the lattice parameter. The subsequent epitaxial insulator layer (430) will be aligned with the larger lattice parameter of the buffer layer and a subsequently deposited silicon layer (440) will be strained. In order for the epitaxial insulator layer to grow aligned with SiGe, a graded SiGe layer (410) is preferably deposited prior to depositing the buffer layer of SiGe (420), which has a constant composition. As in the previous embodiment, other materials that can be grown on an epitaxial insulator and that relax with a lattice parameter different from silicon may be used in place of SiGe. Furthermore, the exact composition of the SiGe buffer layer can be varied to fine tune the amount of strain in the overlying silicon or other mismatched (heteroexpitaxial) semiconductor layer (440).

This embodiment is particularly useful in the situation where it is difficult to grow the desired epitaxial insulator directly on the silicon substrate. A SiGe surface with a flexible lattice parameter (depending on the stoichiometry of the SiGe) may facilitate the growth of epitaxial oxide layers with the desired qualities, such as the desired dislocation density.

Figure 5:
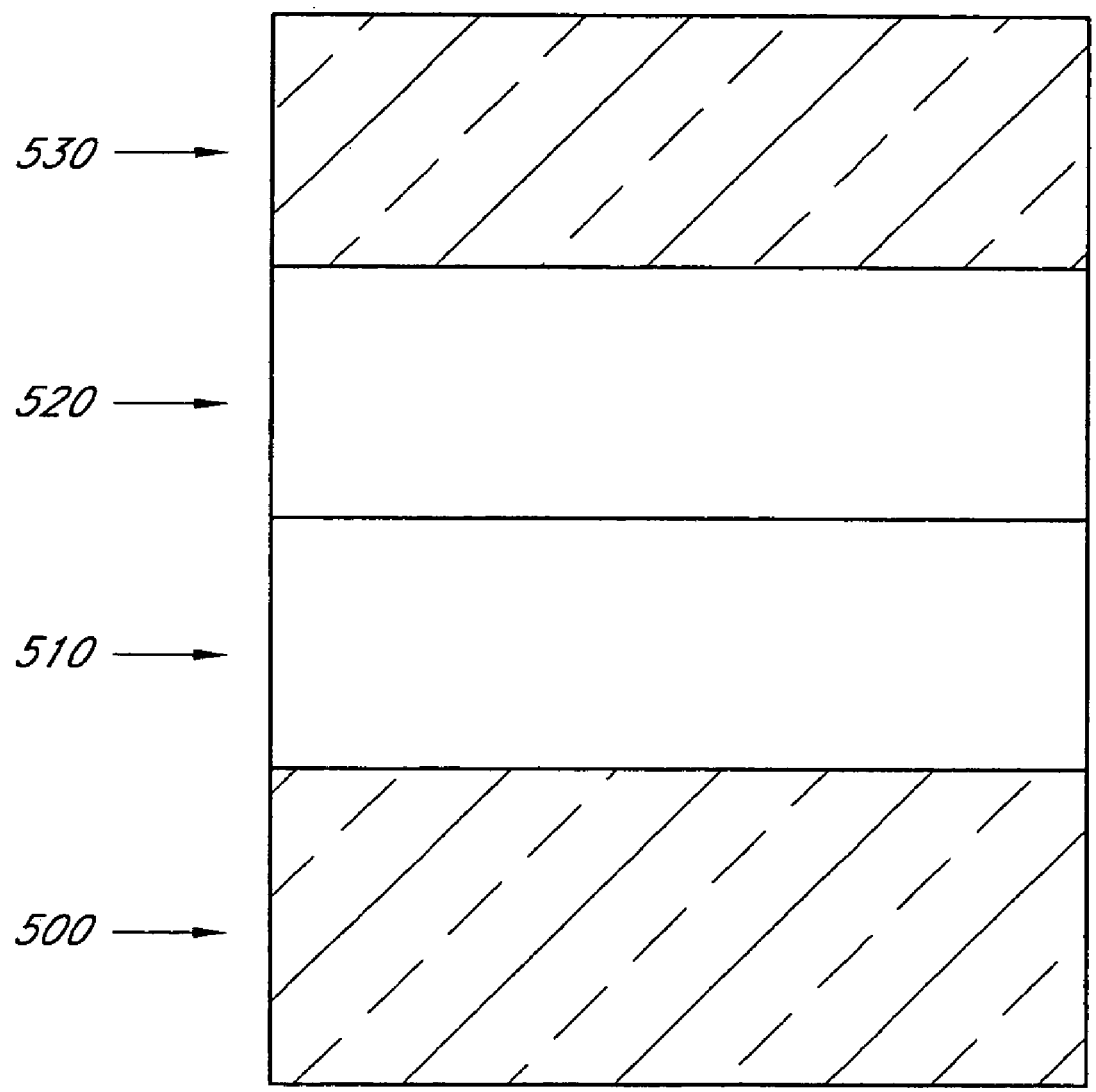
FIG. 5 illustrates a $SiO_2$ layer formed between the substrate and the epitaxial insulator, in accordance with still another embodiment.

Epitaxial formation of the insulating layer is optionally followed by oxidation of the substrate to grow a "thin," amorphous $SiO_2$ layer under the epitaxial layer. The low k $SiO_2$ layer is preferably thick enough that that it determines the capacitance of the total stack. Thus, the $SiO_2$ layer is preferably thick with respect to the thickness of the epitaxial insulating layer. FIG. 5 illustrates a structure comprising a silicon substrate (500), an amorphous $SiO_2$ layer (510), an epitaxial oxide layer (520) over the $SiO_2$ and an active semiconductor layer (530).

The $SiO_2$ layer is preferably formed by exposing the substrate, with an insulating layer of preferably less than about 1000 angstroms, to an oxidizing environment. Any oxidant known in the art may be used, preferably water or oxygen. More preferably, dry oxygen is used. In one embodiment the oxidation is combined with the solid phase epitaxy treatment of an amorphous insulator by addition of oxygenated species during the high temperature anneal. The oxygen species diffuse through the epitaxial insulating layer to form an amorphous $SiO_2$ layer at the interface with the silicon substrate.

The oxidation step preferably does not destroy the crystallinity of epitaxial insulator and, indeed, may help complete the solid phase epitaxy process and stabilize the epitaxial layer. A repair anneal may optionally be performed following the oxidation step.

Preferred Materials

As noted above, crystal structures of the underlying insulator material and the overlying semiconductor layer to be heteroepitaxially deposited over the epitaxial insulator are preferably slightly mismatched to improve carrier mobility. However, the lattice constant and crystalline structure of both materials are preferably close to one another in order to enable heteroepitaxy of the overlying material; otherwise, heteroepitaxy of the overlying material may fail, resulting in poor crystal structure and consequently poor device performance. Preferably, the lattice constant of the insulating material is within ±20% (including perfect matching or 0% mismatch) of the lattice constant of the semiconductor material, more preferably within ±10%, even more preferably within ±5%, and most preferably within ±1% to 3%.

Generally, a mono-crystalline insulating material is provided, and a semiconductor layer having a matching or closely mismatched lattice structure is provided thereover. Any suitable combination of insulating material and semiconductor material meeting this criteria can be employed.

Several dielectric materials have very close lattice constants and structures to that of silicon (which has a body-centered cubic structure and a lattice constant of about 5.43 Å). Namely, cesium oxide ($CeO_2$), aluminum nitride (AlN) and lanthanum aluminum oxide ($LaAlO_3$) all have suitable lattice constants and crystalline structures. Most preferably, $LaAlO_3$ (lattice constant about 5.37 Å) is employed. Not only does $LaAlO_3$ have the advantage of a slightly mismatched lattice constant and similar lattice structure (cubic) to that of silicon (or SiGe), but it has the added advantage of being a ternary structure. As discussed in more detail below, ternary structures can be more readily modulated to achieve the lattice constant and crystal structure desired for matching the crystal structure of the overlying semiconductor layer.

Atomic Layer Deposition Generally

While materials meeting these criteria are available, conventional fabrication techniques for depositing these materials tend to be somewhat complicated and not perfected to the point of production-worthiness for semiconductor fabrication applications. A particular issue with respect to formation of these layers is control over layer thickness uniformity and material composition.

Accordingly, preferred embodiments employ an atomic layer deposition (ALD) process to form the insulating layer indicated at step 100 of FIG. 1. Buffer layers that may be used to ensure strain in the active semiconductor layer may also be deposited by ALD. As is known in the art, ALD generally provides good control over layer uniformity as well as material composition throughout the deposition process, which can be important for depositing the insulator over silicon substrates and for the growth of a subsequent active silicon layer on the insulating layer. Furthermore, ALD can be conducted at very low temperatures as compared to chemical vapor deposition (CVD) and other conventional deposition techniques, leading to very smooth surfaces of the insulating layer.

ALD generally involves alternating and self-limiting surface reactions of two or more different reactants. Reaction temperatures are preferably maintained below the temperatures at which the selected precursors will thermally decompose, but above the temperatures at which the selected precursors condense. This leaves a rather large temperature window for performing ALD.

Figure 2:
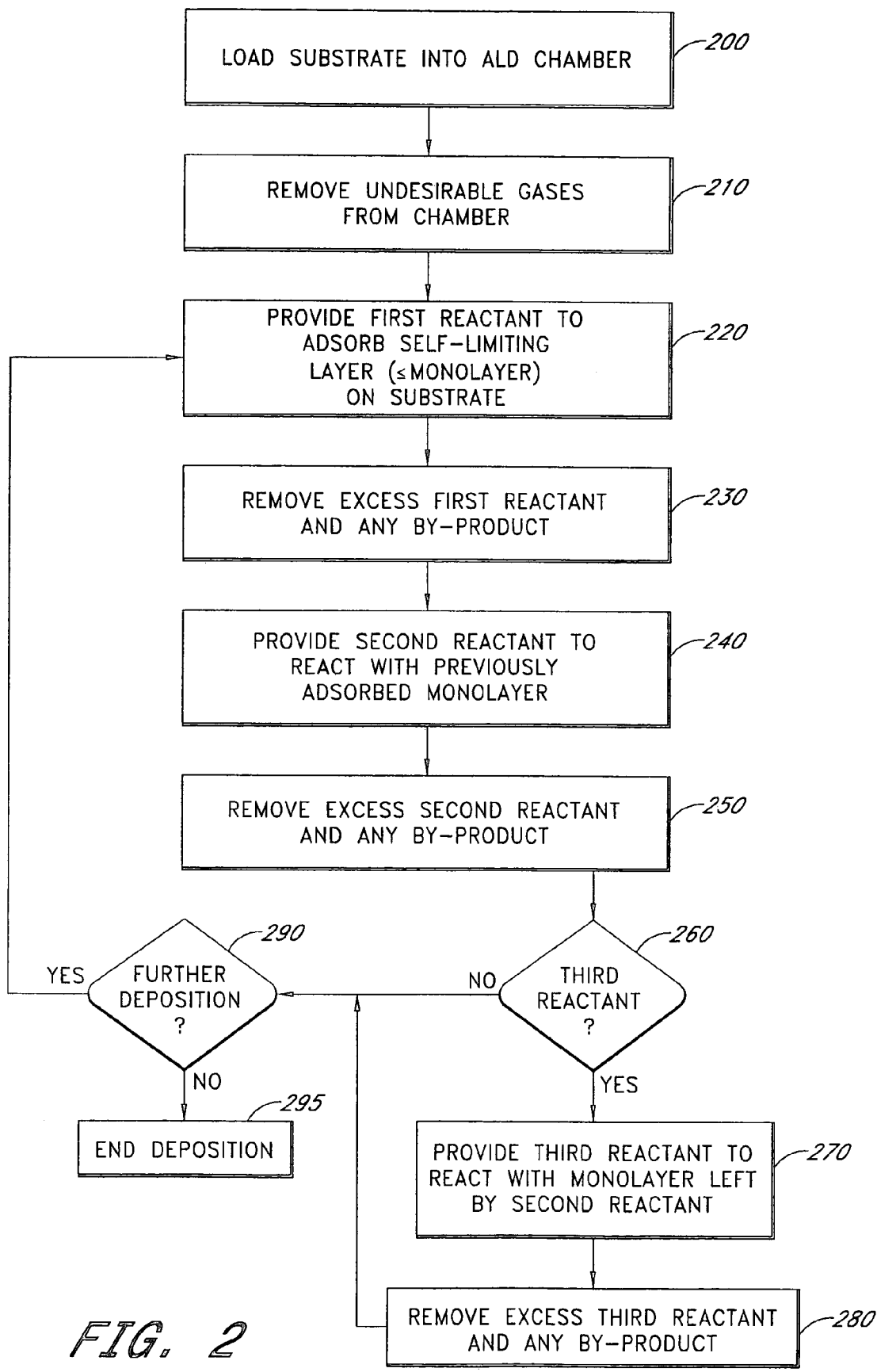
FIG. 2 is a flow chart illustrating a particularly preferred method for depositing an insulating layer in accordance within the methods of FIG. 1.

With reference now to FIG. 2, a flow chart illustrates a generalized deposition process for atomic layer deposition (ALD). Initially, a substrate is loaded 200 into an ALD chamber. An ALD chamber is generally characterized by having separate inflow paths for each reactant, thereby avoiding undesirable mixing of the precursors upstream of the substrate. Such mixing can disadvantageously lead to CVD-type reactions. However, a skilled artisan will appreciate that CVD chambers can also be employed for practicing ALD with careful separation of reactants through reactant pulse and removal timing.

After loading, the gate valve through which the wafer is loaded is preferably closed and undesirable gases are removed 210, such as by purging, until only an inert atmosphere is left within the chamber. In some arrangements, removal 210 can comprise pumping down the chamber to very low pressures; however, purging is preferred because it will generally take less time.

The ALD process proper begins by providing 220 a first reactant, which chemisorbs in a self-limiting manner upon the substrate. For example, the first reactant or precursor may include element(s) to be incorporated into the growing film as well as ligands, at least some of which remain upon the adsorbed layer during deposition. The ligands can serve to prevent further reaction once all of the active sites on the substrate have been occupied. This is also known as a saturative process. While theoretically a full monolayer of the first reactant can adsorb upon the substrate, in reality physical constraints, such as the size of the precursor molecules (stearic hindrance), can prevent full occupation of all theoretically available reactant sites on the substrate. Accordingly, less than a monolayer typically forms per cycle.

Following the first reactant pulse 220 sufficiently lengthy to saturate the surface, any excess first reactant and any by-product of the adsorption process is removed 230 from the chamber. Such removal 230 can comprise pumping down the chamber, but more preferably comprises purging the chamber.

A second reactant pulse 240 follows this removal 230. The second reactant also has a self-limiting effect, in that it will react only with the adsorbed species from the previous pulse 220, and after saturative reaction, no further reaction takes place. The second reaction pulse 240 can, for example, adsorb upon the previously adsorbed monolayer; strip ligands from the previously adsorbed monolayer; or replace the terminating ligands of the adsorbed species with desired elements or compounds for the layer being formed. The second pulse 240 is again followed by a removal 250, which can be pumping down or purging, as disclosed above.

FIG. 2 is a generalized chart for a two- or three-reactant ALD cycle. Accordingly, a decision box 260 is illustrated in which a possibility is given for repeating the two-reactant cycle described above (steps 220 to 250) or continuing on to a third reactant pulse 270 and third removal step 280. The skilled artisan will readily appreciate that three-reactant ALD processes can take a variety of forms. For example, the first pulse 220 can leave an adsorbed layer with self-terminating ligands; the second pulse 240 can reduce the ligands by forming a volatile product by combination of the second reactant with the ligands, whereby the volatile compound has a greater affinity for the ligands than the portion of the first reactant to be incorporated into the film; and the third reactant pulse 270 can then leave desired elements to be incorporated into the deposited film. Alternatively, each of the pulses 220, 240, 270 can leave elements of a ternary material. The skilled artisan will readily appreciate that a great variety of other possibilities exist, including fourth reactant pulses in some cycles or each cycle, etc.

Whether the cycle includes third reactant pulses, fourth reactant pulses, etc., after a cycle is completed it is determined at decision box 290 whether further deposition is desired. If so, deposition continues by repeating the cycle begun by first reactant pulse 220. If sufficient cycles have been conducted to arrive at the desired thickness, on the other hand, deposition is ended 295. The process can then continue with a conversion step 110 (see FIG. 1) in the form of solid phase epitaxy. Alternatively, the ALD process can directly epitaxially deposit the insulator of interest.

It will be understood that the "decision" boxes in FIG. 2 are for illustration of choices in designing the ALD process; in practice, a determined sequence for the entire pulsing process is programmed in advance.

Preferred ALD Processes

As noted above, one example of a suitable insulating layer that can be deposited by ALD is $LaAlO_3$. Methods for depositing $LaAlO_3$ by ALD are disclosed in Nieminen et al., "Surface-Controlled Growth Of $LaAlO_3$ Thin Films By Atomic Layer Epitaxy," *J. Mater. Chem.*, 2001, Vol. 11, pp. 2340-2345, the disclosure of which is incorporated herein by reference.

Nieminen et al. disclose ALD of $LaAlO_3$ by alternated pulses of $La(thd)_3$, $Al(acac)_3$ and ozone, with intermediate purge steps employing nitrogen gas ($N_2$), where thd represents 2,2,6,6-tetramethylheptane-3,5-dionate and acac represents pentane-2,4-dionate. Source containers for $La(thd)_3$ and $Al(acac)_3$ are maintained at 170° C. and 125° C., respectively. Reactor and substrate temperatures are preferably maintained between about 300° C. and 450° C., more preferably between about 350° C. and 380° C. A typical ALD cycle includes the following basic steps:

$La(thd)_3$ pulse (0.8 s to 1.5 s)
$N_2$ purge (1.0 s to 3.0 s)
$Al(acac)_3$ pulse (0.8 s to 1.5 s)
$N_2$ purge (1.0 s to 3.0 s)
$O_3$ pulse (2.0 s)
$N_2$ purge (1.0 s to 3.0 s)

In reality, the frequency of each of the reactant pulses in each cycle may be varied, through routine optimization, to ensure achievement of stoichiometric $LaAlO_3$. Nieminen et al. disclose that a $La(thd)_3$:$Al(acac)_3$ pulsing ratio of about 1.75 to 2.00 results in stoichiometric $LaAlO_3$.at high deposition rates (e.g., 0.36 Å/cycle) to 0.39 Å/cycle) Alternatively, the frequency of each reactant pulse in each cycle may be varied to achieve other ratios of La:Al in the film optimized to result in a desired variation of the crystal lattice constant for matching (or mismatching) the lattice constant of the semiconductor layer to be heteroepitaxially deposited thereover. Where such tailoring of material composition and properties is desirable, the decision at 260 (FIG. 2) can more generally be employed for whether or not to employ a third reactant, and whether to repeat use of one of the first two reactants in the cycle. It will be understood that the "decision" boxes in FIG. 2 are for illustration of choices in designing the ALD process; in practice, a determined sequence for the entire pulsing process is programmed in advance.

More generally, aluminum, lanthanide, oxygen and nitrogen precursors suitable for ALD are listed below. Note that the list is not limiting, and the skilled artisan will be able to identify other suitable precursors for the listed elements, capable of being provided with sufficient vapor pressure to saturate the substrate under desirable ALD conditions. Moreover, insulators in accordance with the present description can include a variety of materials other than the listed elements, providing that the crystal structure is suitable for heterepitaxy of semiconductor materials thereover.

1.1 Alkyl Aluminum Compounds

Alkyl aluminum compounds have at least one aluminum-carbon bond. Examples of source compounds are trimethylaluminum $(CH_3)_3Al$, triethylaluminum $(CH_3CH_2)_3Al$, tri-n-butylaluminum $(n-C_4H_9)_3Al$, diisobutylaluminum hydride $(i-C_4H_9)_2AlH$, diethylaluminum ethoxide $(C_2H_5)_2AlOC_2H_5$, ethylaluminum dichloride $(C_2H_5)_2AlCl_2$, ethylaluminum sesquichloride $(C_2H_5)_3Al_2Cl_3$, diisobutylaluminum chloride $(i-C_4H_9)_2AlCl$ and diethylaluminum iodide $(C_2H_5)_2Al$. These compounds are commercially available from, e.g., Albemarle Corporation, USA.

In the preferred embodiment, trimethylaluminum $(CH_3)_3$ Al is used as the aluminum source chemical.

1.2 Aluminum Alkoxid(Al—O—C Bond)

Aluminum alkoxides contain an aluminum-oxygen-carbon (Al—O—C) bond. Examples of source compounds are aluminum ethoxide $Al(OC_2H_5)_3$, aluminum isopropoxide $Al[OCH(CH_3)_2]_3$ and aluminum s-butoxide $Al(OC_4H_9)_3$. These compounds are commercially available from, e.g., Strem Chemicals, Inc., USA.

1.3 Aluminum Beta-diketonates

Aluminum beta-diketonates have organic ligands coordinated to aluminum via oxygen atoms. Examples of source compounds are aluminum acetylacetonate $Al(CH_3COCHCOCH_3)_3$, often shortened as $Al(acac)_3$, and tris-(2,2,6,6-tetramethyl-3,5heptanedionato)aluminum, usually shortened as $Al(thd)_3$, $Al(TMHD)_3$ or $Al(DPM)_3$. Volatile halogenated aluminum beta-diketonates are also commercially available, such as aluminum hexafluoroacetylacetonate $Al(CF_3COCHCOCF_3)_3$, often shortened as $Al(hfac)_3$. These compounds are commercially available from, e.g., Strem Chemicals, Inc., USA.

1.4 Aluminum Halides

Volatile, purely inorganic aluminum halides such as aluminum chloride $AlCl_3$ or $Al_2Cl_6$, aluminum bromide $AlBr_3$, and aluminum iodide $AlI_3$ may be used as precursors 1.5 Anhydrous Aluminum Nitrate At low substrate temperatures, anhydrous aluminum nitrate can be used as an aluminum source chemical for ALD. The synthesis of anhydrous $Al(NO_3)_3$ has been described by G. N. Shirokova, S. Ya. Zhuk and V. Ya. Rosolovskii in *Russian Journal of Inorganic Chemistry*, vol. 21, 1976, pp. 799-802, the disclosure of which is incorporated herein by reference. The aluminum nitrate molecule breaks into aluminum oxide when it is contacted with organic compounds, such as ethers.

2. Lanthanide Precursors

Lanthanides can be made volatile with selected ligands that prevent interaction between lanthanide atoms in the precursor or source. Examples of suitable ligands include beta-diketonates, such as thd (thd=2,2,6,6-tetramethyl-3,5-heptanedione) and alkyldisilazanes, such as hmds (hmds=$N(Si(CH_3)_3)_2$). Physically stable lanthanides from which to form these precursors include scandium (Sc), yttrium (Y), lanthanum (La), cerium Ce, praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu).

3. Oxygen Source Materials

Volatile or gaseous compounds that contain oxygen and are capable of reacting with an aluminum and/or lanthanide source compounds on the substrate surface are used as oxygen source materials. The choice of oxygen source material may be influenced by the substrate on which the layer is to be deposited. Suitable oxygen sources include hydrogen peroxide, ozone, and with unpaired electrons, water, alcohols (such as methanol, ethanol and isopropanol). Alcohols are especially reactive with aluminum halides.

4. Nitrogen Source Materials

Volatile or gaseous nitrogen source chemicals include ammonia ($NH_3$); salts of ammonia, preferably halide salt, in particular ammonium fluoride or ammonium chloride; hydrogen azide ($HN_3$) and the alkyl derivatives thereof, compound such as $CH_3N_3$; hydrazine ($N_2H_4$) and salts of hydrazine such as hydrazine hydrochloride; organic derivatives of hydrazine such as dimethyl hydrazine; nitrogen fluoride ($NF_3$); primary, secondary and tertiary amines such as methylamine, diethylamine and triethylamine; nitrogen radicals such as $NH_2^*$, $NH^{}$ and $N^{*}$ where "*" designates a free electron capable of forming a bond; and other excited species including nitrogen (N).

Solid Phase Epitaxy of Insulator

With properly cleaned substrate surfaces prior to ALD, careful high temperature annealing of an amorphous material, having a similar crystal structure and lattice constant to that of the underlying substrate, will result in conversion of the amorphous material to a single-crystal structure. In the case of the exemplary $LaAlO_3$ insulator discussed above, Nieminen et al. disclosed that depositing the amorphous insulator over a $SrTiO_3$ substrate, and subsequently annealing at 900° C. for about 10-30 minutes results in a high quality, epitaxial and smooth $LaAlO_3$ insulator. Heteroepitaxy of a semiconductor can be supported thereover. Similarly, $LaAlO_3$ deposited over a pristine silicon surface can be converted by solid phase epitaxy to a single-crystal structure.

General Discussion

Advantageously, ALD is suitable for both tailoring and varying composition of the insulating layer and/or buffer layers. For example, the lower interface with the silicon substrate may have one set of compositional and structural requirements while the upper interface with the active semiconductor layer may have other requirements. Similarly, bulk properties of the insulator may also be advantageously different from one or both interfaces.

Ratios of constituent elements and impurities can be readily incorporated and controlled on very fine levels by varying the pulse constituents in various cycles of ALD. Co-pending U.S. patent application Ser. No. 09/800,757, filed Mar. 6, 2001, for example, discloses methods for grading concentrations of elements within a film during an ALD process, such as by periodically introducing or omitting particular pulses from the cycles, or by introducing varying amounts of thermodynamically competing chemicals within a single pulse. The disclosure of U.S. patent application Ser. No. 09/800,757 is incorporated herein by reference.

Such tailoring is particularly advantageous when employing ternary compounds for the insulating layer. For example, to tailor the lattice constant of $LaAlO_3$ it may be desirable to vary the relative concentration of La and Al during the ALD cycles. The lattice constant of the resultant ternary insulator (following solid phase epitaxy) can be calculated or empirically measured as a product of relative concentrations of $Al_2O_3$ and $La_2O_3$ phases within the material.

Tailoring bulk properties relative to interface properties may also involve forming completely different materials at different phases of the deposition. For example, one material may be first deposited for achieving desired bulk properties of the insulator, while a second or interface insulating material is formed thereover in sufficient thickness to serve as the heteroepitaxy template for the overlying semiconductor layer. ALD can be employed only for the interface insulating material, where acceptable non-ALD processes are readily available for the bulk material, in which case time savings can be achieved.

Although the foregoing invention has been described in terms of certain preferred embodiments, other embodiments will become apparent to those of ordinary skill in the art in view of the disclosure herein. Accordingly, the present invention is not intended to be limited by the recitation of preferred embodiments, but is intended to be defined solely by reference to the appended claims.

We claim:

1. A method for forming a semiconductor-on-insulator structure, comprising:
    forming an epitaxial insulator over a substrate; and
    forming an epitaxial semiconductor over the epitaxial insulator, wherein forming the epitaxial insulator comprises:
        depositing an amorphous insulating layer, wherein depositing the amorphous insulating layer comprises an atomic layer deposition process; and
        converting the amorphous insulating layer to a single-crystal material by solid phase epitaxy.

2. The method of claim 1, wherein the amorphous insulating layer comprises a ternary oxide.

3. The method of claim 1, wherein the atomic layer deposition process comprises pulsing source chemicals in a plurality of cycles.

4. The method of claim 3, wherein the frequency of pulses in different cycles is varied to tailor the composition of the amorphous insulating layer.

5. The process of claim 1, wherein the atomic layer deposition process is modified to achieve the desired composition of the insulating layer.

6. The process of claim 1, wherein the semiconductor comprises strained silicon.

7. A method for forming a semiconductor-on-insulator structure, comprising:
    forming an epitaxial insulator over a substrate; and
    forming an epitaxial semiconductor over the epitaxial insulator, wherein forming the epitaxial insulator comprises:
        depositing an amorphous insulating layer;
        converting the amorphous insulating layer to a single-crystal material by solid phase epitaxy, and oxidizing the substrate during the solid phase epitaxy.

8. A method for forming a semiconductor-on-insulator structure, comprising:
    forming an epitaxial insulator over a substrate, wherein the epitaxial insulator comprises greater than two elements; and
    forming an epitaxial semiconductor over the epitaxial insulator, wherein forming the epitaxial insulator comprises:
        depositing an amorphous insulating layer; and
        converting the amorphous insulating layer to a single-crystal material by solid phase epitaxy.

9. The method of claim 8, wherein the epitaxial insulator comprises lanthanum aluminum oxide.

10. A process for forming an integrated circuit, comprising:
    depositing an amorphous insulating layer over a semiconductor substrate, wherein depositing the amorphous insulator comprises forming a compound having greater than or equal to three elements;

converting the amorphous insulating layer into a highly crystalline material; and heteroepitaxially depositing a semiconductor structure over the amorphous insulating layer after converting.

11. A method for forming a semiconductor-on-insulator structure, comprising:

forming an epitaxial insulator over a substrate; and forming an epitaxial semiconductor over the epitaxial insulator, wherein forming the epitaxial insulator comprises:

depositing an amorphous insulating layer, wherein depositing the amorphous insulator comprises depositing a ternary oxide by an atomic layer deposition process; and converting the amorphous insulating layer to a single-crystal material by solid phase epitaxy.

12. A process for forming an integrated circuit, comprising:

depositing an amorphous insulating layer over a semiconductor substrate, wherein depositing the amorphous insulator comprises maintaining the semiconductor substrate substantially free of a native oxide;

converting the amorphous insulating layer into a highly crystalline material; and heteroepitaxially depositing a semiconductor structure over the amorphous insulating layer after converting.

\* \* \* \* \*